United States Patent
Nam

(10) Patent No.: US 7,678,651 B2
(45) Date of Patent: Mar. 16, 2010

(54) METHOD FOR FABRICATING SEMICONDUCTOR DEVICE

(75) Inventor: Ki-Won Nam, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 829 days.

(21) Appl. No.: 11/477,895

(22) Filed: Jun. 28, 2006

(65) Prior Publication Data

US 2007/0134936 A1 Jun. 14, 2007

(30) Foreign Application Priority Data

Dec. 12, 2005 (KR) .................... 10-2005-0121689

(51) Int. Cl.
 *H01L 21/336* (2006.01)
(52) U.S. Cl. .................. 438/259; 438/253; 438/699; 438/706; 438/770; 257/E21.205; 257/E21.429
(58) Field of Classification Search ............... 438/259, 438/253, 699, 706, 770; 257/E21.205, E21.429
See application file for complete search history.

(56) References Cited

U.S. PATENT DOCUMENTS

| | | | | |
|---|---|---|---|---|
| 5,879,986 | A * | 3/1999 | Sung | 438/253 |
| 6,468,914 | B1 * | 10/2002 | Jang et al. | 438/699 |
| 2005/0233591 | A1 * | 10/2005 | Schmitt et al. | 438/706 |

FOREIGN PATENT DOCUMENTS

KR 10-2005-0065148 6/2005

* cited by examiner

*Primary Examiner*—Alexander G Ghyka
*Assistant Examiner*—Abdulfattah Mustapha
(74) *Attorney, Agent, or Firm*—Blakley, Sokoloff, Taylor & Zafman LLP

(57) ABSTRACT

A method for fabricating a semiconductor device includes: providing a substrate structure in which a plurality of gate lines are already formed; forming a capping layer over the substrate structure; oxidizing the capping layer; and forming an insulation layer over the oxidized capping layer. The capping layer may include a nitride-based material. The insulation layer may include substantially the same material as the capping layer. The oxidizing of the capping layer may comprise performing a radical oxidation process.

8 Claims, 3 Drawing Sheets

METHOD FOR FABRICATING SEMICONDUCTOR DEVICE

FIELD OF THE INVENTION

The present invention relates to a method for fabricating a semiconductor device; and more particularly, to a method for fabricating a semiconductor device to reduce a self-aligned contact failure of a landing plug contact.

DESCRIPTION OF RELATED ARTS

In a landing plug contact (LPC) module process of dynamic random access memory (DRAM) devices with a size of approximately 80 nm or lower, although the size of the devices has been reduced, a thickness of a gate spacer has not been decreased. Accordingly, it may be difficult to perform a LPC opening process and a gap-filling process.

Particularly, in case of the DRAM devices, there may be a height difference between an active region and a field region when a recess gate is used to improve a refresh property. As a result, a difference in a stress of a silicide layer which forms a gate pattern may be generated. The difference in the stress of the silicide layer causes an excessive oxidation on sidewalls of the silicide layer and thus, a self-aligned contact (SAC) fail may often be induced.

FIGS. 1A and 1B are cross-sectional views illustrating a typical method for fabricating a semiconductor device.

As shown in FIG. 1A, a device isolation structure 11 is formed in a certain portion of a substrate 10 by performing a shallow trench isolation (STI) process. Then, a plurality of recesses 12 are formed in predetermined portions of the substrate 10.

A gate insulation layer 13 is formed over the above resulting structure. Afterwards, a plurality of recess gate lines G are formed over the gate insulation layer 13 being partially filled into the recesses 12. Each of the recess gate lines G is formed by sequentially stacking the gate insulation layer 13, a polysilicon layer 14, a tungsten silicide layer 15, a gate hard mask 16, and an anti-reflective coating layer 17.

When a photoresist layer (not shown) is formed over the gate hard mask 16, a photolithograph process is performed on thereafter. The photolithograph process can be easily performed due to the anti-reflective coating layer 17. The anti-reflective coating layer 17 is formed of silicon oxynitride (SiON).

After forming the recess gate lines G, a light oxidation process is performed at a temperature ranging from approximately 700° C. to approximately 900° C. As a result, an oxide layer 18 is formed on sidewalls of the polysilicon layer 14 and the tungsten silicide layer 15 exposed by the light oxidation process.

The oxide layer 18 is excessively grown on both sidewalls of the recess gate lines G due to an abnormal oxidation of the tungsten silicide layer 15 during the light oxidation process.

As described above, after performing a light oxidation process, an abnormal oxidation may occur in the tungsten silicide layer because the tungsten silicide layer has different levels of stress caused by a height difference between the recess gate and the device isolation structure. Afterwards, sidewalls of the tungsten silicide layer are more likely to be damaged during the landing plug contact (LPC) process. Accordingly, a SAC fail may be induced.

A region where the oxide layer 18 is excessively grown over the sidewalls of the recess gate lines G is denoted with reference letter A.

As shown in FIG. 1B, an ion-implantation process is performed on the above resulting structure in which the oxide layer 18 is excessively formed due to the abnormal oxidation of the tungsten silicide layer 15. Then, a buffer oxide layer 19 and a spacer nitride layer 20 are sequentially formed to reduce a stress of a nitride layer.

The buffer oxide layer 19 and the spacer nitride layer 20 are formed over a projected profile shown as the region A in FIG. 1A. Hence, the buffer oxide layer 19 and the spacer nitride layer 20 have the same projected profile as the region A. Reference letter B denotes a region where the buffer oxide layer 19 and the spacer nitride layer 20 are projected due to the excessive growth of the oxide layer 18.

During a landing plug contact (LPC) process, the region B is exposed too much. Thus, the spacer nitride layer 20 formed around the region B is etched and the buffer oxide layer 19 becomes exposed and etched. When the buffer oxide layer 19 is etched, an electric short-circuit may be generated between a landing plug and a gate.

More specifically, after forming the spacer nitride layer 20, an oxide-based inter-layer insulation layer (not shown) is formed. Afterwards, an etching process is performed to form a landing plug contact (LPC). During the etching process, the spacer nitride layer 20 formed around the projected region B is etched and as a result, the buffer oxide layer 19 also formed around the projected region B is exposed and etched. If a polysilicon layer for a landing plug is formed over the above resulting structure, a landing plug and a gate may be electrically short-circuited through the buffer oxide layer 19. Accordingly, a self-aligned contact (SAC) fail may be induced. Also, the abnormal oxidation may take place by a reaction between silicon atoms of the tungsten silicide layer and oxygen gas used for the light oxidation process.

SUMMARY OF THE INVENTION

It is, therefore, an object of the present invention to provide a method for fabricating a semiconductor device, wherein the method reduces a self-aligned contact fail of a landing plug contact.

In accordance with one aspect of the present invention, there is provided a method for fabricating a semiconductor device, including: providing a substrate structure in which a plurality of gate lines are already formed; forming a capping layer over the substrate structure; oxidizing the capping layer; and forming an insulation layer over the oxidized capping layer.

In accordance with another aspect of the present invention, there is provided a method for fabricating a semiconductor device, including: providing a substrate structure in which a plurality of recess gate lines are already formed; forming a nitride-based layer over the substrate structure; oxidizing the nitride-based layer; and forming an insulation layer over the oxidized nitride-based layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on certain embodiments of the present invention will be provided with reference to the accompanying drawings.

Figure 1A:
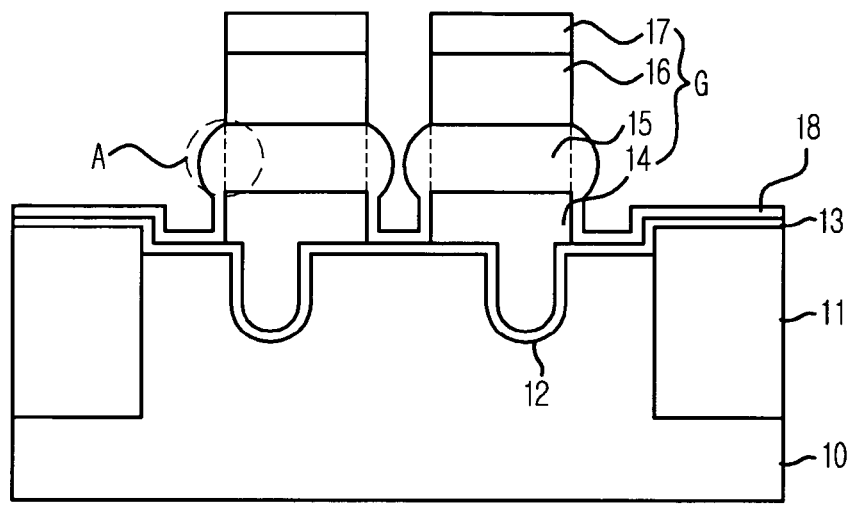
FIGS. 1A and 1B are cross-sectional views illustrating a typical method for fabricating a semiconductor device.
Figure 1B:
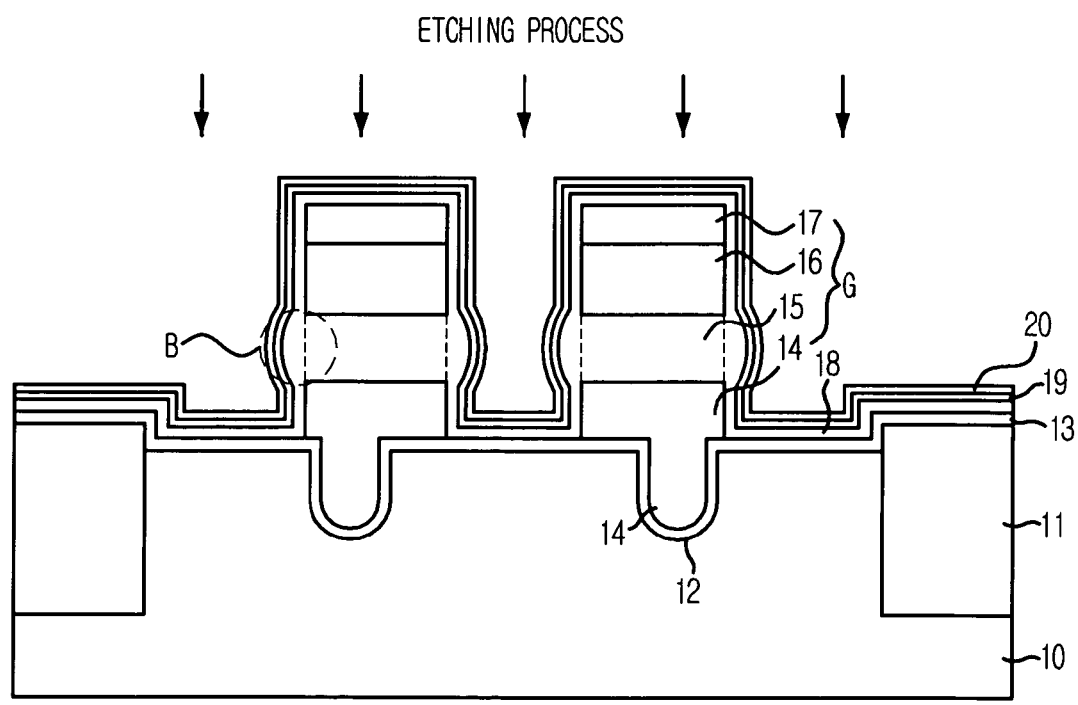
Figure 2A:
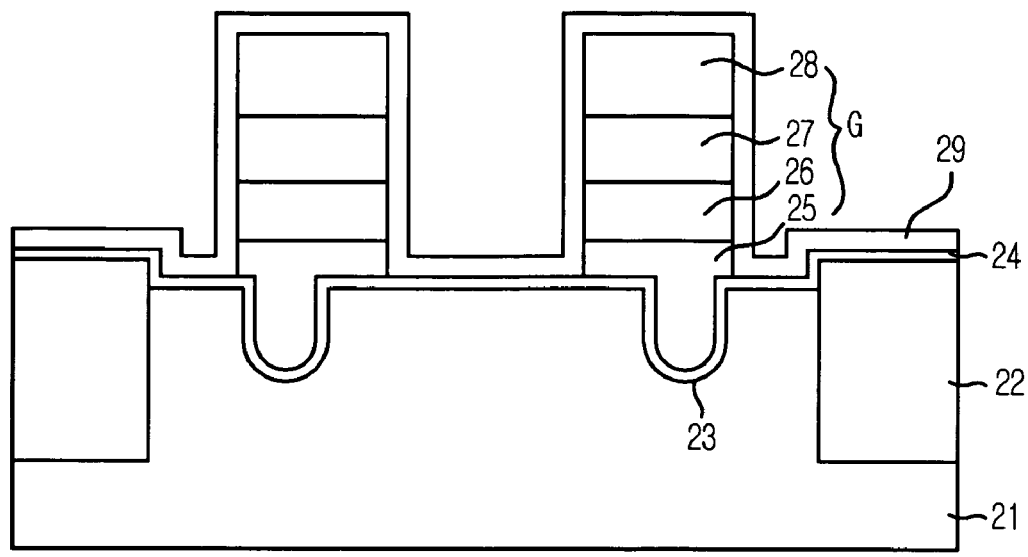
FIGS. 2A to 2C are cross-sectional views illustrating a method for fabricating a semiconductor device in accordance with an embodiment of the present invention.
Figure 2B:
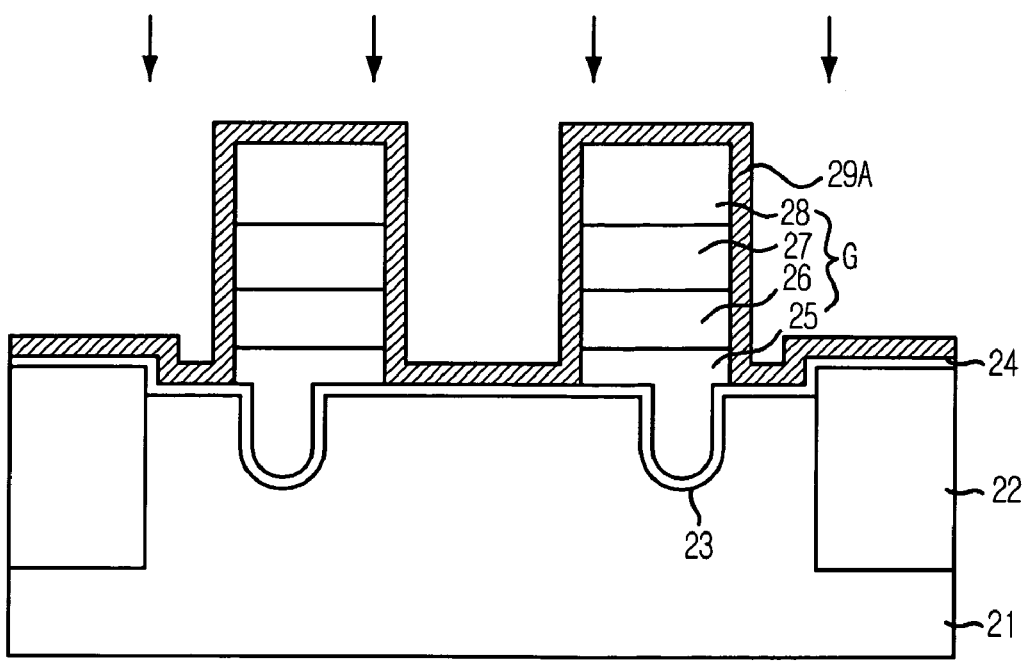
Figure 2C:
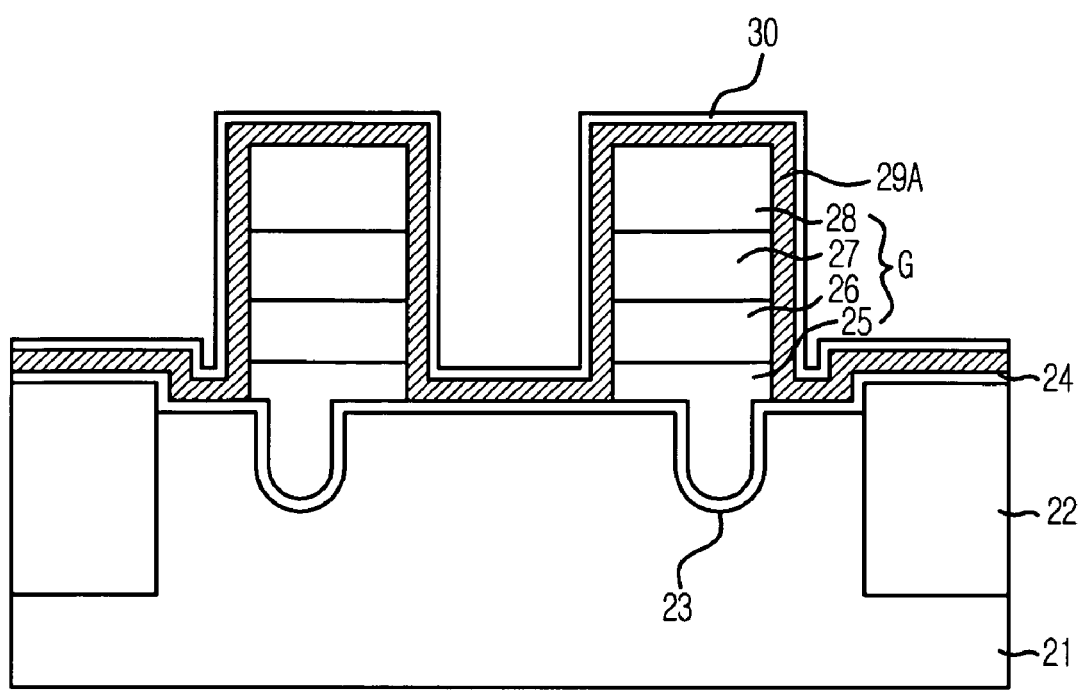

FIGS. 2A to 2C are cross-sectional views illustrating a method for fabricating a semiconductor device in accordance with an embodiment of the present invention.

As shown in FIG. 2A, a plurality of device isolation layers 22 are formed in certain portions of a substrate 21 through a shallow trench isolation (STI) process. Then, a plurality of recesses 23 are formed in predetermined portions of the substrate 21.

A gate insulation layer 24 is formed over the above resulting structure and afterwards, a plurality of recess gate lines G are formed over the gate insulation layer 24 being partially filled into the recesses 23. Each of the recess gate lines G is formed by sequentially stacking the gate insulation layer 24, a polysilicon layer 25, a tungsten silicide layer 26, a gate hard mask 27, and an anti-reflective coating layer 28.

When a photoresist layer (not shown) is formed over the hard mask 27, and a photolithograph process is performed on the hard mask 27 thereafter. The photolithography process can be easily performed due to the anti-reflective coating layer 27. The anti-reflective coating layer 27 is formed of silicon oxynitride (SiON).

A capping layer 29 is formed over a profile of the substrate 21 and the recess gate lines G. The capping layer 29 is formed to a thickness ranging from approximately 30 Å to approximately 80 Å. The capping layer 29 has the same thickness as an oxide layer formed through a light oxidation process of the typical method.

The capping layer 29 includes a nitride-based material such as $Si_xN_y$, wherein x and y are natural numbers greater than approximately 1. For instance, the capping layer 29 is formed by using a mixture gas including silane ($SiH_4$), ammonia ($NH_3$), and nitrogen ($N_2$) at a temperature ranging from approximately 400° C. to approximately 600° C. Compared to the typical method, according to this embodiment of the present invention, the capping layer 29 is formed through a nitride layer deposition process and thus, silicon of the tungsten silicide layer 26 does not react with oxygen ($O_2$) As a result, the capping layer 29 can be stably formed over sidewalls of the tungsten silicide layer 26.

As shown in FIG. 2B, a radical oxidation process is performed on the above resulting substrate structure 21 to oxidize the capping layer 29. As a result, an oxide layer 29A is formed. The nitride-based layer (i.e., the capping layer 29) is transformed to the oxide layer 29A using $O_2$ ions and hydrogen ($H_2$) ions at a low pressure. In more detail, $H_2$ or $H_2O$ is mixed with $O_2$ (i.e., $O_2/H_2$ or $O_2/H_2O$) at a pressure ranging from approximately 0.3 Torr to approximately 1.5 Torr and a temperature ranging from approximately 400° C. to approximately 700° C. Thus, the $O_2$ ions react with silicon included in a nitride layer to form a silicon oxide ($SiO_2$) layer. As a result, only the capping layer 29 is transformed to the oxide layer 29A.

The tungsten silicide layer 26 is capped by the nitride-based capping layer 29 during the radical oxidation process. Thus, the tungsten silicide layer 26 is not exposed to an oxidation reaction. Accordingly, an abnormal oxidation of a tungsten silicon layer often occurring in the typical method can be reduced. Specifically, the abnormal oxidation of a silicide layer can be reduced by performing an oxidation process at a low temperature not at a high temperature of approximately 700° C. or higher.

As shown in FIG. 2C, a spacer layer 30 is formed over a surface of the oxide layer 29A. The spacer layer 30 includes a nitride-based material. Although not shown, an inter-layer oxide layer is formed over the substrate 21 and the recess gate lines G and then, a landing plug contact (LPC) process is performed to form a landing plug contact (LPC).

As described above, after forming the recess gate lines G, a capping layer is formed and then, a radical oxidation process is performed at a low temperature ranging from approximately 400° C. to approximately 700° C. to oxidize the capping layer. As a result, an abnormal oxidation of a tungsten silicide layer can be reduced, and an oxide layer reducing stress on a substrate during a LPC process and damage caused during an ion-implantation process can be stably formed. Accordingly, a property of devices can be improved and a SAC fail of the LPC can be reduced.

According to this embodiment of the present invention, a capping layer is formed over recess gate lines before performing a radical oxidation process. Then, an oxide layer is formed by using a radical oxidation process at a temperature ranging from approximately 400° C. to approximately 700° C. As a result, silicon atoms existing in a silicide layer of the typical method do not react with $O_2$ to reduce an oxidation. An abnormal oxidation of a tungsten silicide layer and a stress generated between a device isolation layer and a tungsten silicide layer can be reduced.

The present application contains subject matter related to the Korean patent application No. KR 2005-0121689, filed in the Korean Patent Office on Dec. 12, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising:
    providing a substrate structure in which a plurality of gate lines are already formed;
    forming a capping layer over the entire substrate structure;
    oxidizing the capping layer; and
    forming an insulation layer over the entire oxidized capping layer,
    wherein the capping layer includes a nitride-based material, the gate lines include at least tungsten silicide, and the oxidizing of the capping layer comprises a radical oxidation process.

2. The method of claim 1, wherein the insulation layer includes substantially the same material as the capping layer.

3. The method of claim 2, wherein the forming of the capping layer comprises using a mixture gas including silane ($SiH_4$), ammonia ($NH_3$), and hydrogen ($H_2$).

4. The method of claim 2, wherein the forming of the capping layer is performed at a temperature ranging from approximately 400° C. to approximately 600° C.

5. The method of claim 1, wherein the radical oxidation process is performed at a pressure ranging from approximately 0.3 Torr to approximately 1.5 Torr.

6. The method of claim 1, wherein the radical oxidation process is performed at temperature ranging from approximately 400° C. to approximately 700° C.

7. The method of claim 1, wherein the radical oxidation process comprises mixing and reacting oxygen ($O_2$) with one of deoxidized water ($H_2O$) and hydrogen ($H_2$) to make the $O_2$ react with silicon of the capping layer to thereby form a silicon oxide layer ($SiO_2$).

8. The method of claim 1, wherein the gate lines comprise recess gate lines.

* * * * *